United States Patent
Atherton

(10) Patent No.: US 7,893,686 B1
(45) Date of Patent: Feb. 22, 2011

(54) POWER CORD VOLTAGE INDICATOR

(76) Inventor: John C. Atherton, 10255 SW. Homestead La., Beaverton, OR (US) 97008

(*) Notice: Subject to any disclaimer, the term of this patent is extended or adjusted under 35 U.S.C. 154(b) by 267 days.

(21) Appl. No.: 12/133,806

(22) Filed: Jun. 5, 2008

(51) Int. Cl.
G01R 19/14 (2006.01)
(52) U.S. Cl. .................................. 324/133; 324/149
(58) Field of Classification Search ................ 324/133
See application file for complete search history.

(56) References Cited

U.S. PATENT DOCUMENTS

| | | | |
|---|---|---|---|
| 2,091,521 A | 8/1937 | Pattison | |
| 2,449,150 A | 9/1948 | Schnoll | |
| 4,199,800 A * | 4/1980 | Weit | 361/239 |
| 4,829,289 A | 5/1989 | Kallman | |
| 5,070,301 A | 12/1991 | Schweitzer, Jr. | |
| 5,077,520 A | 12/1991 | Schweitzer, Jr. | |
| 5,095,265 A | 3/1992 | Schweitzer, Jr. | |
| 5,150,058 A | 9/1992 | Johnson | |
| 5,274,324 A | 12/1993 | Schweitzer, Jr. | |
| 5,293,113 A * | 3/1994 | Beha et al. | 324/72.5 |
| 5,363,088 A | 11/1994 | Schweitzer, Jr. | |
| 5,424,630 A | 6/1995 | Vazquez | |
| 5,428,288 A | 6/1995 | Foreman | |
| 5,714,738 A * | 2/1998 | Hauschulz et al. | 219/535 |
| 6,054,849 A * | 4/2000 | Collier et al. | 324/133 |
| 6,137,285 A * | 10/2000 | Walsten et al. | 324/133 |
| 6,157,184 A | 12/2000 | Atherton | |
| 2004/0264065 A1 * | 12/2004 | Ionescu et al. | 360/323 |
| 2009/0107972 A1 * | 4/2009 | Naylor et al. | 219/162 |

FOREIGN PATENT DOCUMENTS

| | | |
|---|---|---|
| CA | 474305 | 6/1951 |
| CA | 728300 | 2/1966 |
| CA | 993952 | 7/1976 |
| CH | 221666 | 8/1942 |

* cited by examiner

Primary Examiner—Thomas Valone
(74) Attorney, Agent, or Firm—Chernoff, Vilhauer, McClung & Stenzel

(57) ABSTRACT

A voltage indicator for mounting on a power cord (FIG. 3) for indicating the presence or absence of a single-phase AC voltage potential on a monitored power cord for a grounded AC power distribution system. The indicator comprises; a housing (16,18), an electronic display (10), a static suppression resistor (12), a first conductive element (14) in physical proximity to the monitored power cord, and a second conductive element (22) meant to be touched by a human being to provide a visual indication of the presence or absence of a voltage potential on the monitored power cord. A capacitive coupling (FIG. 1) takes place between the "hot" conductor of the power cord and the first conductive element (14) of the indicator. This causes a voltage drop across the display (10) and the resistor (12) in parallel with the display (10). The current flow from the display (10) and the resistor (12) merge together to return to ground through a human being touching a second conductive element (22). The path of current flow is completed by the power source ground connection. The indicator is electrically insulated from the power cord it monitors due to the insulation on the power cord at the location of the indicator. The monitored power cord can be a two conductor power cord ("hot" and neutral) or a three conductor power cord ("hot", neutral, and ground).

16 Claims, 4 Drawing Sheets

POWER CORD VOLTAGE INDICATOR

BACKGROUND

1. Field of Invention

National Field of Invention

One version of the voltage indicator is intended for single-phase AC voltage detection on 90-130 volt (with respect to ground) rms line cords used in grounded AC power distribution systems as is common in the United States.

2. International Field of Invention

Another version of the voltage indicator is intended for single-phase AC voltage detection on 200-230 volt (with respect to ground) rms line cords used in grounded AC power distribution systems as is common in most countries outside the United States.

2. Description of the Prior Art

Consumers of electric power have long been inconvenienced with the problem of determining whether there is electric power going to an appliance or device that they're about to use. Traditionally they just switch the appliance or device on to see if it works. Not all appliances can be determined to be operable at the moment the power switch is turned on.

Examples of this are coffee makers, soldering irons, and clothes irons that don't have visual power indicators. The failure or unknown question of whether an appliance or device is instantaneously working leads to the natural question; "Is there power going to the appliance or device?" It is the intent of this invention to provide a simple and almost instantaneous answer to this question. Although the present invention doesn't represent a necessity in many applications, it does represent a convenience to expedite the troubleshooting process.

The purpose of this invention is to provide a simple, convenient, and almost instantaneous indication of whether there's an AC single-phase voltage potential present on an AC line cord, but first a discussion of the prior art.

U.S. Pat. No. 5,424,630 to Vazquez (1995) is for a voltage indicator that has a knife blade as one electrical contact and an alligator clip as the other electrical contact of the voltage indicator. The two disadvantages of this indicator are readily apparent. The knife blade contact is used to cut through the insulation on the wire thus permanently damaging it, and the alligator clip needs a grounded electrical terminal to be clipped on to complete the circuit.

U.S. Pat. No. 5,428,288 to Foreman et al. (1995) and U.S. Pat. No. 2,449,150 to Schnoll (1948) are for related indicators. In both of these patents a thin electrical connecting wafer is slid over the male end of a standard electric power plug. A common disadvantage of both of these inventions is that the thin wafer decreases the quality of the electrical connection of the male plug to the power receptacle. The Foreman et al. patent also requires the use of a computer to sense a power failure while in the Schnoll patent the indicator can only be read at the male plug and not at anywhere along the length of the power cord as with the present invention.

U.S. Pat. No. 4,829,289 to Kallman et al. (1989) and Canadian patent 728,300 to Windsor (1966) are for related indicators. The patents are for an illuminated plug that goes between the power receptacle and the male end of the power cord plug. Both of these devices have the disadvantage of being usable at a power receptacle which may be behind a piece of furniture. In the Windsor patent the appliance or device connected to the plug has the additional disadvantage of needing to be turned on in order for the path through the illuminated indicator to be complete.

Swiss patent 221,666 to Gerber (1942) and Canadian patent 474,305 to Simmons (1951) are for related indicators. These two patents are for a screwdriver or pen type of voltage indicator that uses a return path to ground for the indicator circuit through a human being. While the method of using a human as the return path to ground is the same ground return method as in the present invention, the two patents have the disadvantage of needing to make physical contact between the indicator's probe tip and the metal of the conductors under test. The present invention only requires that the indicator be in physical proximity to a power cord under test with no metal-to-metal contact between the conductors of the power cord and the indicator's electrode.

Canadian patent 993,952 to Friesen (1976) is for a power cord voltage indicator in which metallic contacts pierce the conductors of the power cord under test. The piercing of the power cord conductors has the disadvantage of doing permanent damage to the power cord insulation as well as the disadvantage of being unusable on power cords that are completely enclosed in an outer sheath.

U.S. Pat. No. 5,095,265 to Schweitzer Jr. (1992) is for a coaxial power cord voltage indicator in which capacitive sensor must pierce through the outer conductive jacket of the coaxial cable in order to be operative. The patent is limited in use to only coaxial cables in which the outer sheath is electrically conductive due to the need to provide a ground return path. The present invention is usable without piercing the power cord. Other patents to Schweitzer Jr. for related devices are U.S. Pat. No. 5,077,520 (1991), U.S. Pat. No. 5,363,088 (1994) and U.S. Pat. No. 5,070,301 (1991). These are all for coaxial cables with a ground return on the outer coaxial conductor. The present invention uses a human ground return.

U.S. Pat. No. 2,091,521 to Pattison (1937) is for a voltage test instrument that has an analog scale, and it's used one "hot" wire at a time while the present indicator is physically mounted to two or more conductors and only indicates the presence or absence of a voltage without an analog scale.

U.S. Pat. No. 6,157,184 to myself (2000) is for a voltage indicator that uses the same schematic diagram as the present invention while the embodiments of that indicator are very bulky and clumsy compared to the embodiment of the present invention.

A substantial advantage of the present power cord voltage indicator is that it doesn't use a battery or a power source other than the power cord under test. Most voltage indicators use a battery.

Reasons for Utility of Invention

1. Device can be physically mounted anywhere on line cord.
2. Device doesn't physically damage line cord.
3. Circuit breaker or fuse may be tripped or blown at main panel.
4. Incandescent light bulb filament may be burned out.
5. Ground fault circuit interrupter may be tripped.
6. Receptacle may be controlled by a light switch.
7. The plug-in point is at a remote location.
8. The appliance may be burned out or defective.
9. The power cord may have been accidentally yanked from receptacle.
10. Appliance may contain a heating or cooling element that would take several minutes to know if turned on.
11. Catastrophic failure fuse may be blown in appliance.

SUMMARY OF THE INVENTION

In accordance with a first aspect of the invention there is provided an AC voltage indicator for mounting on a power cord including an insulated hot conductor for indicating the presence or absence of voltage on a power cord connected to a grounded AC power distribution system comprising a flexible base of sheet-form electrically insulating material for wrapping around said power cord, the flexible base having first and second opposite main sides, an attachment means secured to the flexible base for securing the flexible base in a configuration in which it is wrapped around the power cord, the attachment means being releasable whereby the flexible base may be unwrapped from the power cord, a status indicating means comprising a high impedance display device having at least a first and second display electrode connected in parallel with a static suppression resistor, the status indicating means being attached to the flexible base at the first main side, a first conductive element in physical proximity to, and electrically insulated from, said power cord, said first conductive element being attached to the flexible base at the second main side thereof and being electrically connected to said first electrode of said display device, and a second conductive element that is exposed for touching by a human being and is electrically connected to said second electrode of said display device, whereby the presence or absence of voltage on the insulated hot conductor of the power cord is indicated by a change in the appearance of said display device when said second conductive element is connected to ground through a human being.

In accordance with a second aspect of the invention there is provided a method of determining the presence or absence of an electrical potential voltage on a power cord including an insulated hot conductor, said method comprising providing an AC voltage indicator for mounting on the power cord comprising a flexible base of sheet-form electrically insulating material, the flexible base having first and second opposite main sides, a status indicating means comprising a high impedance display device having at least a first and second display electrode connected in parallel with a static suppression resistor, the status indicating means being attached to the flexible base at the first main side, a first conductive element in physical proximity to, and electrically insulated from, said power cord, said first conductive element being attached to the flexible base at the second main side thereof and being electrically connected to said first electrode of said display device, and a second conductive element that is exposed for touching by a human being and is electrically connected to said second electrode of said display device, wrapping the flexible base around the power cord with the second main side inward, toward the power cord, and the first side outward, so that the display device can be viewed by a user of the AC voltage indicator, whereby the presence or absence of voltage on the insulated hot conductor of the power cord is indicated by a change in the appearance of said display device when said second conductive element is capacitively connected to ground, capacitively coupling said second conductive element to ground, and viewing said status indicating means to determine the status indicating display appearance.

BRIEF DESCRIPTION OF THE DRAWINGS

For a better understanding of the invention, and to show how the same may be carried into effect, reference will now be made, by way of example, to the accompanying drawings, in which.

REFERENCE NUMBERS IN DRAWINGS

| | |
|---|---|
| 10 | Liquid Crystal Display (LCD) (1) |
| 11 | "Two Dashes" Symbol on (LCD) (1) |
| 12 | Static Suppression Resistor (1) |
| 14 | Adhesive First Conductive Foil Element (1) |
| 16 | Clear Plastic Housing (Edge Channel) (1) |
| 18 | Wrappable Leather Base (1) |
| 20 | Machine Locknuts (2) |
| 22 | Braided Second Conductive Element (1) |
| 24 | Nylon Machine Screw (1) |
| 26 | Soldered on Ring Terminal (1) |
| 28 | Hook Strap Fastener (2) |
| 30 | Loop Base Fastener (2) |
| 32 | Nylon Machine Screws (2) |
| 34 | Metal Machine Screw (1) |
| 36 | Metal Flat Washer (1) |
| 38 | Machine Locknuts (2) |

DETAILED DESCRIPTION

FIG. 3, FIG. 4

Figure 3:
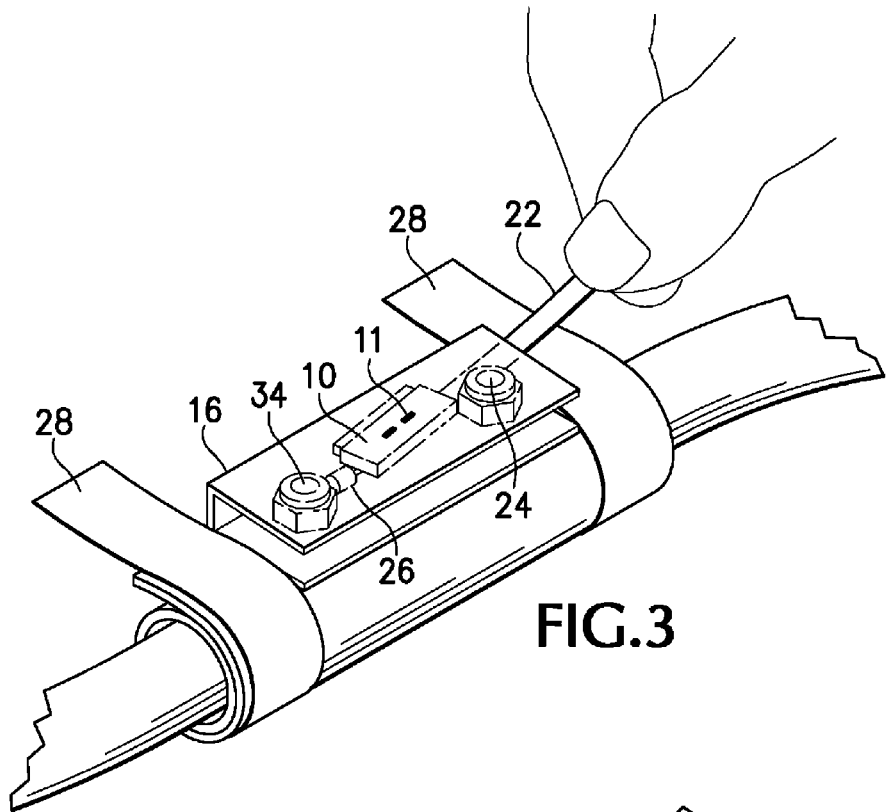
FIG. 3 is a preferred embodiment of the voltage indicator.

An adhesive aluminum foil first conductive element 14 is attached to the leather base 18 in FIG. 3 on the inside side (cord side) of the wrap. A metal screw 34 provided with a flat washer (not shown) passes through the foil first conductive element 14, the leather base 18, the inner wall of the clear plastic housing 16 and the ring lug 26 and engages the first locknut 20. In this manner, the conductive element 14 is electrically connected to the ring lug 26. A nylon machine screw 24 provided with a flat washer (not shown) passes through the foil first conductive element 14, the leather base 18 and the inner wall of the clear plastic housing 16 and engages the second locknut 20. The screws 24, 34 thus secure the housing 26 to the leather base 18.

Figure 4:
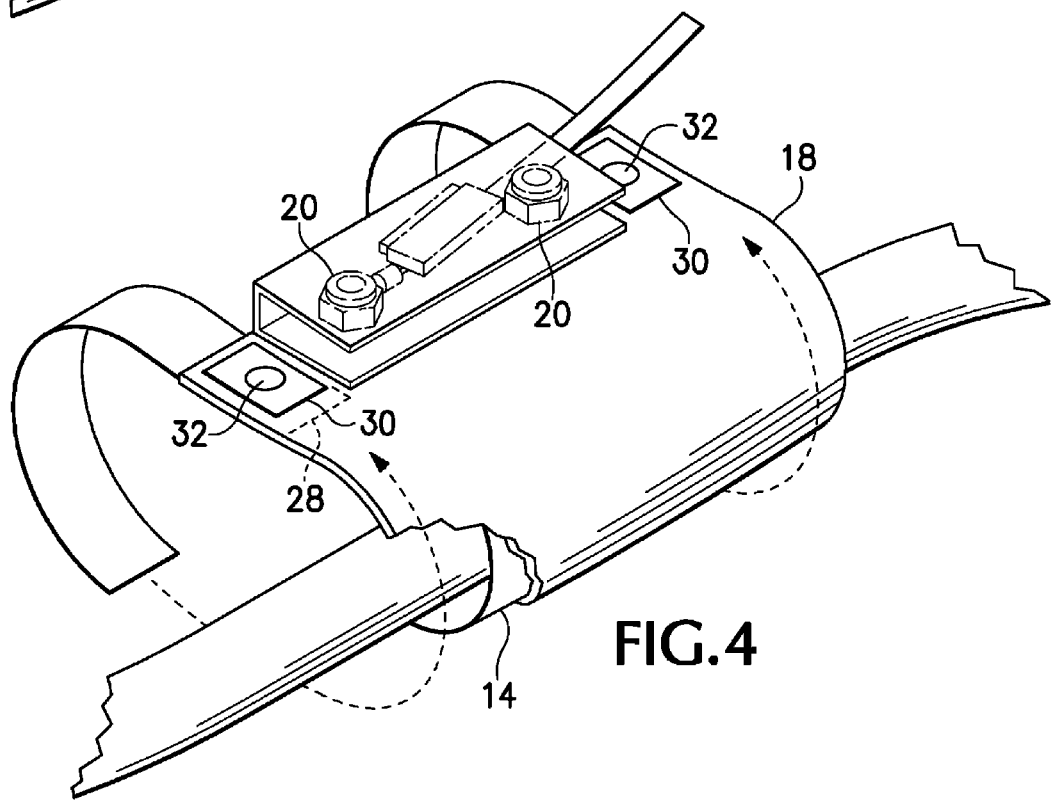
FIG. 4 shows how the indicator is wrapped around a power cord.

A hook and loop fastener system (strap 28 with hooks, pad 30 with loops) is attached to the leather base 18 with two nylon flat head machine screws 32 and a locknut (not shown) in FIG. 4. A person having ordinary skill in the art can see how to wrap the indicator around a power cord and secure it with the hook and loop fastener system from the exploded view of FIG. 4.

The plastic housing 16 prevents inadvertent contact with the metal screw 34 or its locknut 20.

Figure 1:
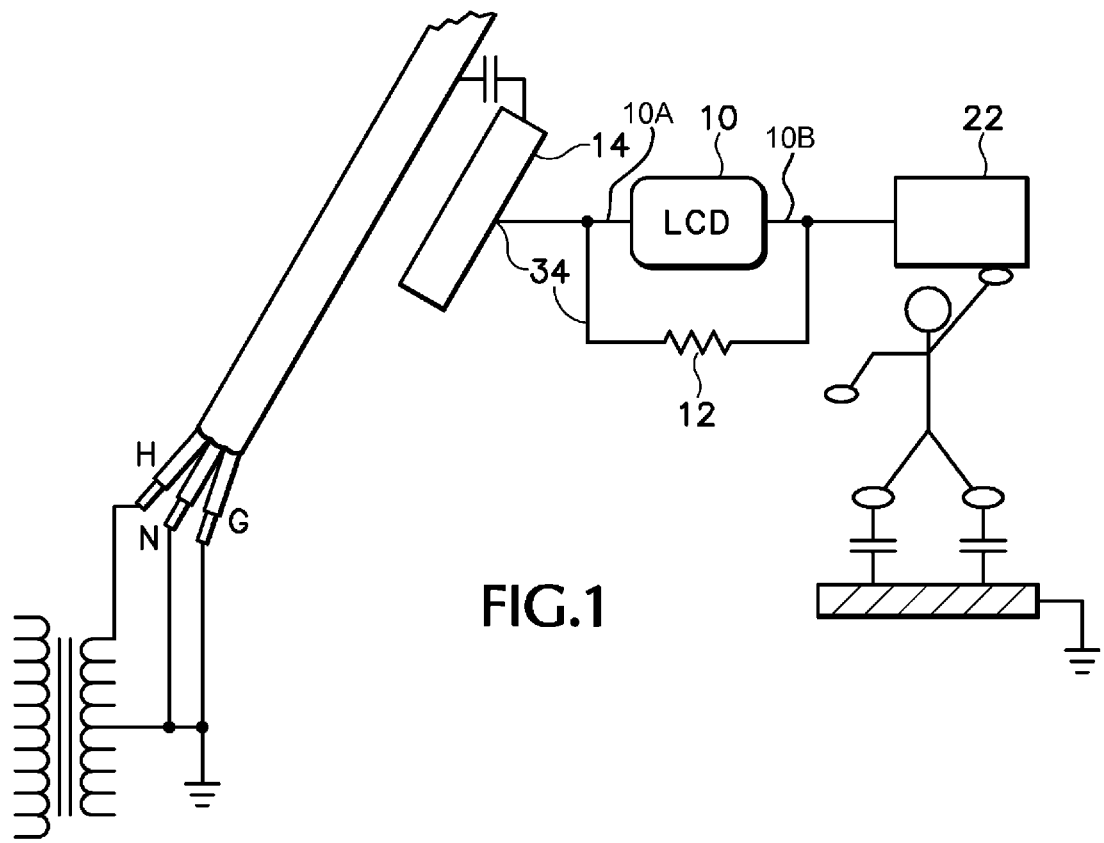
FIG. 1 is a schematic diagram of the indicator monitoring a grounded power cord.
Figure 2A:
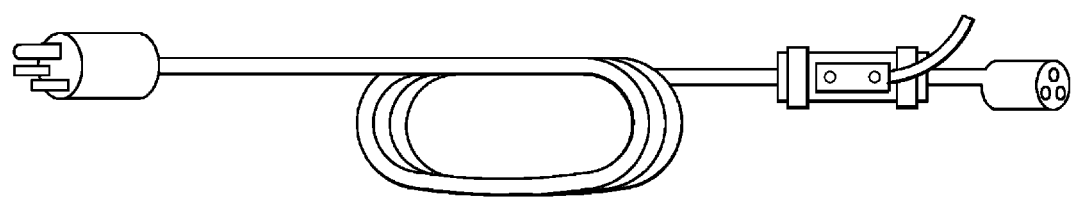
FIGS. 2A-2D are applications of the indicator.
Figure 2B:
Figure 2C:
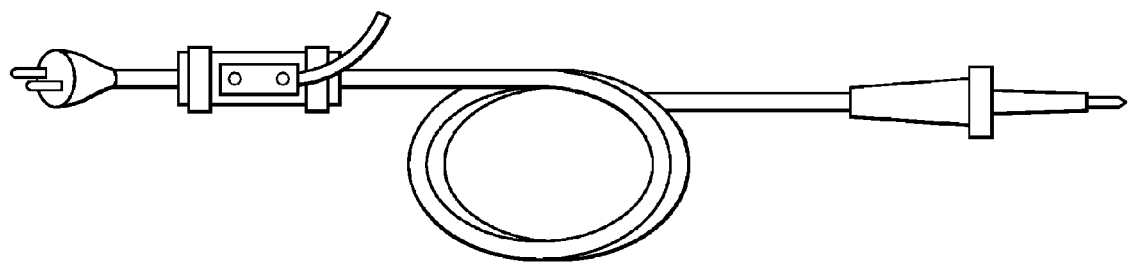
Figure 2D:
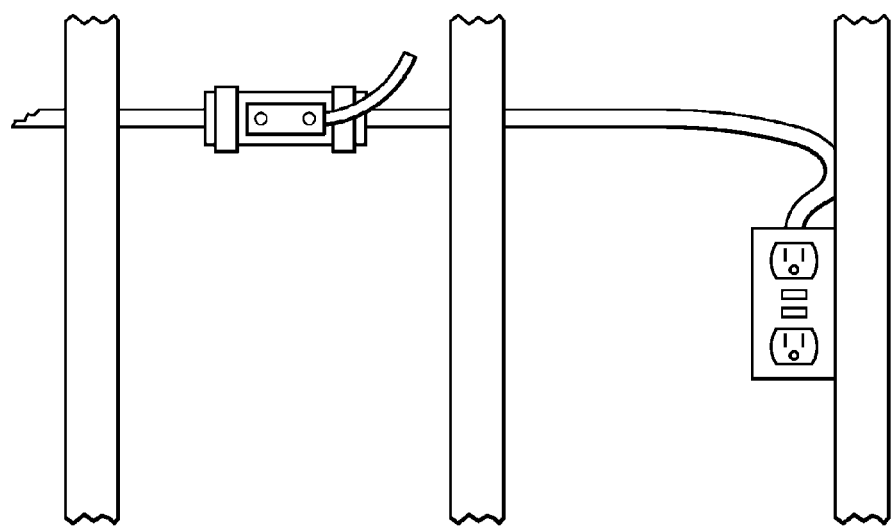

FIG. 1 shows a liquid crystal display 10 that is a two lead device with "two dashes" symbol 11 that is turned on and off by the presence and absence respectively of AC potential voltage in the monitored conductors when a human touches a second conductive element 22. A solder joint connects the ring lug 26 to one display electrode 10A of the display 10 and supports the display relative to housing 16. A solder joint also connects the touchable second conductive element 22 to a second display electrode 10B of the display 10 and resistor 12. These solder connections also complete a parallel connection between the liquid crystal display 10 and static suppression resistor 12. The second conductive element 22 is made of finely braided copper wire. The second conductive element 22 is clamped between the second locknut 20 and the housing 16 for strain-relief purposes.

Referring to FIG. 1, the national version of the voltage indicator uses approximately a 22 megohm static suppression resistor 12. The international version of the voltage indicator uses approximately a 5 megohm static suppression resistor 12. The minimum operating voltage of the liquid crystal display (LCD) 10 for both versions is 2.0 volts AC at 50 to 60 hertz. The face of the liquid crystal display (LCD) 10 could have two dashes on it or a "lightning bolt with an arrow head" symbol on it. The monitored power cord can be a two conductor power cord ("hot" and neutral) or a three conductor power cord ("hot", neutral, and ground).

Figure 5:
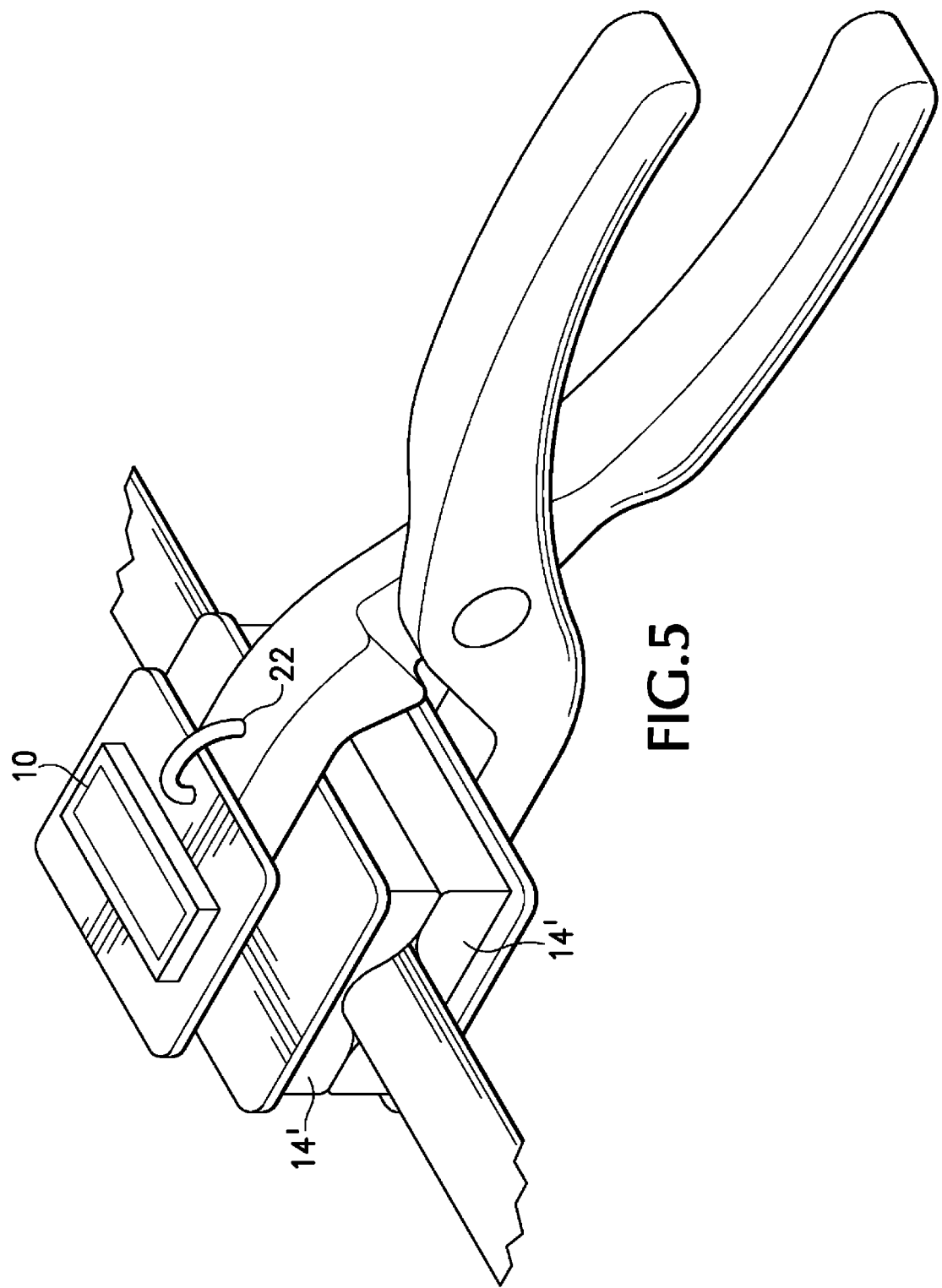
FIG. 5 is a pliers based testing tool made out of the voltage indicator.

Referring to FIG. 5, two first conductive element foam pads 14 are used in the indicator. The conductive foam pads 14' are material that is used for the static sensitive storage of integrated circuits. The conductive foam pads 14' are epoxy glued to the top phenolic insulating layer and a bottom phenolic insulating layer. A first wire connects the liquid crystal display 10 to the top conductive foam pad 14' by physically touching the top conductive foam pad 14'. The two pads 14' make electrical contact with each other on either side of a monitored power cord due to the compression provided by the jaws of the pliers.

Operation and Use FIG. 1, FIGS. 2A-2D, FIG. 5

FIG. 1 gives a schematic diagram of the power cord voltage indicator circuit. A person having ordinary skill in the art can understand this circuit if the person understands capacitive coupling. Capacitors pass AC while blocking DC. If the power cord is energized, the liquid crystal display 10 is turned on when the second conductive element 22 is grounded, e.g. by being touched by a human being; if the power cord is not energized, the display remains off when the conductive element 22 is grounded. The exact location of the indicator on the power cord depends on where the liquid crystal display (LCD) 10 can be seen from, and where on the cord it's out of the persons way.

FIGS. 2A-2D show several of the more common uses of the device.

FIG. 5 shows a pliers based testing tool made out of the power cord voltage indicator. FIG. 3 is the preferred embodiment of the indicator. Both the national and international forms of the indicator are physically the same except for the resistance value of the static suppression resistor 12.

The less preferred alternate embodiment of the indicator, the pliers testing tool (FIG. 5) uses the schematic diagram of FIG. 1. In the pliers version of the indicator, conductive foam pads 14' are used as the first element 14. These pads are of the carbon impregnated type that are used for the static sensitive storage of integrated circuits. A second wire 22 electrically connects the display 10 to the metal pliers frame.

A substantial advantage of the present indicator is that it doesn't require a battery as so many other types of voltage indicators do.

SUMMARY, RAMIFICATIONS, AND SCOPE

Accordingly, the reader will see that the National and International Power Cord Voltage Indicator of this patent application provides a convenient and inherently simple method for the determination of an AC voltage potential on a power cord. A summary of the reasons for the usefulness of this invention was included in the "Reasons for Utility of This Invention" section.

Possible ramifications of this invention include but are not limited to making the housing in the form of a pliers so that a portable testing tool can be made that temporarily is placed on a power cord. The indicator could also be made out of other materials. Although the description above contains certain specificities, these should not be construed as limiting the scope of the invention but as merely providing illustrations of the currently preferred embodiment.

The invention claimed is:

1. An AC voltage indicator for mounting on a power cord including an insulated hot conductor for indicating the presence or absence of voltage on a power cord connected to a grounded AC power distribution system comprising:
   a flexible base of sheet-form electrically insulating material for wrapping around said power cord, the flexible base having first and second opposite main sides,
   an attachment means secured to the flexible base for securing the flexible base in a configuration in which it is wrapped around the power cord, the attachment means being releasable whereby the flexible base may be unwrapped from the power cord,
   a status indicating means comprising a high impedance display device having at least first and second display electrodes connected in parallel with a static suppression resistor, the status indicating means being attached to the flexible base at the first main side,
   a first conductive element in physical proximity to, and electrically insulated from, said power cord, said first conductive element being attached to the flexible base at the second main side thereof and being electrically connected to said first display electrode of said display device, and
   a second conductive element that is exposed for touching by a human being and is electrically connected to said second display electrode of said display device,
   whereby the presence or absence of voltage on the insulated hot conductor of the power cord is indicated by a change in the appearance of said display device when said second conductive element is connected to ground through a human being.

2. The indicator of claim 1 wherein the said display device is a liquid crystal display with a minimum operating voltage of 2.0 volts.

3. The indicator of claim 1 wherein said resistor has a resistance value of 22 megohms.

4. The indicator of claim 1 wherein said resistor has a resistance value of 5 megohms.

5. The indicator of claim 1 wherein said display device displays dashes when electrically energized.

6. The indicator of claim 1 wherein the attachment means comprises hook and loop fastener material including a first component attached to the flexible base at the first main side thereof and a second component attached to the flexible base at the second main side.

7. The indicator of claim 1, wherein the first conductive element comprises a metallic foil.

8. The indicator of claim 1, comprising a protective housing attached to the flexible base at the first main side and containing the status indicating means.

9. A method of determining the presence or absence of an electrical potential voltage on a power cord including an insulated hot conductor, said method comprising:
   providing an AC voltage indicator for mounting on the power cord comprising a flexible base of sheet-form electrically insulating material, the flexible base having first and second opposite main sides, a status indicating means comprising a high impedance display device having at least first and second display electrodes connected in parallel with a static suppression resistor, the status indicating means being attached to the flexible base at the first main side, a first conductive element in physical proximity to, and electrically insulated from, said power cord, said first conductive element being attached to the flexible base at the second main side thereof and being electrically connected to said first display electrode of said display device, and a second conductive element that is exposed for touching by a human being and is electrically connected to said second display electrode of said display device, wrapping the flexible base around the power cord with the second main side inward, toward the power cord, and the first side outward, so that the display device can be viewed by a user of the AC voltage indicator, whereby the presence or absence of voltage on the insulated hot conductor of the power cord is indicated by a change in the appearance of said display device when said second conductive element is capacitively connected to ground, capacitively coupling said second conductive element to ground, and viewing said status indicating means to determine the status indicating display appearance.

10. The method of claim 9 wherein the said display device is a liquid crystal display with a minimum operating voltage of 2.0 volts.

11. The method of claim 9 wherein said resistor has a resistance value of 22 megohms.

12. The method of claim 9 wherein said resistor has a resistance value of 5 megohms.

13. The method of claim 9 wherein said display device displays dashes when electrically energized.

14. The method of claim 9 wherein the attachment means comprises hook and loop fastener material including a first component attached to the flexible base at the first main side thereof and a second component attached to the flexible base at the second main side.

15. The method of claim 9, wherein the first conductive element comprises a metallic foil.

16. The method of claim 9, comprising a protective housing attached to the flexible base at the first main side and containing the status indicating means.

* * * * *